United States Patent [19]

Mallary

[11] Patent Number: 5,085,935
[45] Date of Patent: Feb. 4, 1992

[54] FLUX SPREADING THIN FILM MAGNETIC DEVICES

[75] Inventor: Michael L. Mallary, Berlin, Mass.

[73] Assignee: Digital Equipment Corporation, Maynard, Mass.

[21] Appl. No.: 360,421

[22] Filed: Jun. 2, 1989

Related U.S. Application Data

[63] Continuation-in-part of Ser. No. 227,808, Aug. 3, 1988.

[51] Int. Cl.$^5$ .................. G11B 23/00; H01F 10/08
[52] U.S. Cl. .................. 428/336; 428/457; 428/469; 428/692; 428/693; 428/694; 428/699; 428/900; 428/928; 360/110; 360/111; 360/113; 360/125; 360/126; 360/127
[58] Field of Search ............... 428/457, 469, 692, 693, 428/694, 699, 900, 336; 360/110, 111, 113, 125, 126, 127

[56] References Cited

U.S. PATENT DOCUMENTS

| | | | |
|---|---|---|---|
| 3,549,825 | 12/1970 | Trimble | 179/100.2 |
| 3,880,602 | 4/1975 | Valin et al. | 29/195 |
| 3,947,889 | 3/1976 | Lazzari | 360/113 |
| 3,961,299 | 6/1976 | Lazzari et al. | 336/218 |
| 3,967,368 | 7/1976 | Brock et al. | 29/603 |
| 4,103,315 | 7/1978 | Hempstead et al. | 360/110 |
| 4,165,525 | 8/1979 | Koel et al. | 360/125 |
| 4,179,719 | 12/1979 | Imamura et al. | 360/112 |
| 4,223,360 | 9/1980 | Sansom et al. | 360/123 |
| 4,228,473 | 10/1980 | Himuro et al. | 360/114 |
| 4,242,710 | 12/1980 | Hempstead et al. | 360/113 |
| 4,335,410 | 6/1982 | Neu | 360/123 |
| 4,356,523 | 10/1982 | Yeh | 360/113 |
| 4,374,403 | 2/1983 | Oshima et al. | 360/113 |
| 4,376,337 | 3/1983 | Kobayasi et al. | 29/603 |
| 4,413,296 | 11/1983 | Jeffers | 360/113 |
| 4,535,375 | 8/1985 | Mowry et al. | 360/113 |
| 4,566,050 | 1/1986 | Beam et al. | 360/113 |
| 4,604,670 | 8/1986 | Visser | 360/127 |
| 4,613,918 | 9/1986 | Kanai et al. | 360/113 |
| 4,626,946 | 12/1986 | Vinal | 360/113 |
| 4,639,811 | 1/1987 | Diepers et al. | 360/125 |
| 4,649,447 | 3/1987 | Huang et al. | 360/447 |
| 4,656,546 | 4/1987 | Mallary | 360/110 |
| 4,663,685 | 5/1987 | Tsang | 360/113 |
| 4,668,913 | 5/1987 | Vinal | 324/235 |
| 4,695,351 | 9/1987 | Mallary | 204/15 |
| 4,698,711 | 10/1987 | Vinal | 360/113 |
| 4,710,838 | 12/1987 | Jahnke | 360/125 |
| 4,750,072 | 6/1988 | Takagi | 360/126 |
| 4,803,580 | 2/1989 | Mowry | 360/113 |
| 4,816,947 | 3/1989 | Vinal et al. | 360/113 |
| 4,825,318 | 4/1989 | Hoo et al. | 360/121 |
| 4,891,725 | 1/1990 | Mowry | 360/113 |
| 4,912,584 | 3/1990 | Mallary et al. | 360/126 |

FOREIGN PATENT DOCUMENTS

| | | |
|---|---|---|
| 0147126 | 1/1984 | European Pat. Off. . |
| 0114076 | 12/1984 | European Pat. Off. . |
| 0154005 | 9/1985 | European Pat. Off. . |
| 0353911 | 7/1989 | European Pat. Off. . |
| 56-163517 | 12/1981 | Japan . |
| 57-141013 | 9/1982 | Japan . |
| 57-164416 | 10/1982 | Japan . |
| 61-229209 | 10/1986 | Japan . |

OTHER PUBLICATIONS

Vinal, (IBM Techical Disclosure Bulletin, vol. 26, No. 7B, Dec. 1983).

(List continued on next page.)

Primary Examiner—Merrell C. Cashion, Jr.
Assistant Examiner—Steven A. Resan
Attorney, Agent, or Firm—Fish & Richardson

[57] ABSTRACT

One aspect of the invention is a method of flux conduction comprising providing a structure with anisotropy not purely in the transverse in-plane direction such that flux spreading into the transverse in-plane direction can occur by rotation. Apparatus includes a thin film magnetic recording device having at least one pole with two magnetic layers and capable of conducting signal flux, a first of the magnetic layers having domains oriented in a first direction, a second of said magnetic layers having domains oriented in a second distinct direction, the layers coupled to each other such that signal flux can flow therebetween. Method of making and various embodiments disclosed.

78 Claims, 6 Drawing Sheets

OTHER PUBLICATIONS

Jeffers, "Magnetoresistive Transducer with Canted Easy Axis", IEEE Transactions on Magnetics, vol. Mag-15, No. 6, Nov. 1979, pp. 1628–1629.

Oshiki, "A Thin-Film Head for Perpendicular Magnetic Recording", J. Appl. Phys., 53(3), Mar. 1982, pp. 2593–2595.

Potter, "Self-Consistent Computer Calculations for Perpendicular Magnetic Recording", IEEE Transactions on Magnetics, vol. MAG-16, No. 5, Sep. 1980, pp. 967–972.

Shinagawa, "Simulation of Perpendicular Recording on Co-Cr Media with a Thin Permalloy Film-Ferrite Composite Head", J. Appl. Phys., 53(3), Mar. 1982, pp. 2585–2587.

Iwaski, "An Analysis for the Magnetization Mode for High Density Magnetic Recording", IEEE Transactions on Magnetics, vol. MAG-13, No. 5, Sep. 1977, pp. 1272–1277.

Mallary et al., "Frequency Response of Thin-Film Heads with Longitudinal and Transverse Anisotropy", IEEE Transactions on Magnetics, vol. 26, No. 5, Sep. 1990, pp. 1334–1336.

Mallary et al., "Three-Dimensional Transmission Line Model for Flux Conduction in Thin-Film Recording Heads", J. Appl. Phys., 67(9), May, 1990, pp. 4863–4865.

Mallary et al., "Conduction of Flux at High Frequencies by a Charge Free Magnetization Distribution", IEEE Transactions on Magnetics, vol. 24, No. 6, Nov. 1988, pp. 2374–2376.

M. Mallary, Conduction of Flux at High Frequencies in Permalloy Strips by Small-Angle Rotations, J. Appl. Phys., 57(1), 15 Apr. 85.

Slonczewski, Micromagnetics of Laminated Permalloy Films, IEEE Transactions on Magnetics, vol. 24, No. 3, May 1988, pp. 2045–2053.

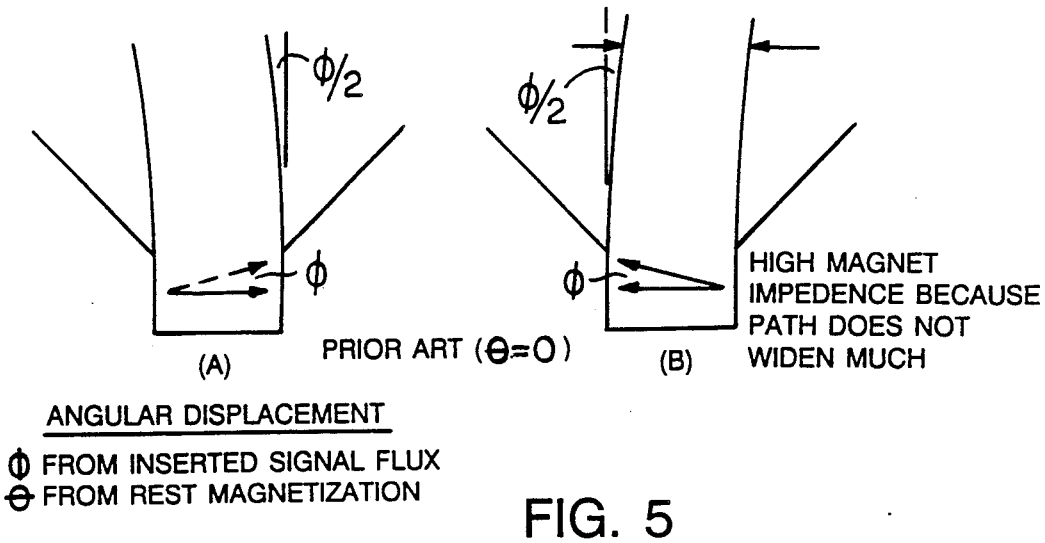
FIG. 5
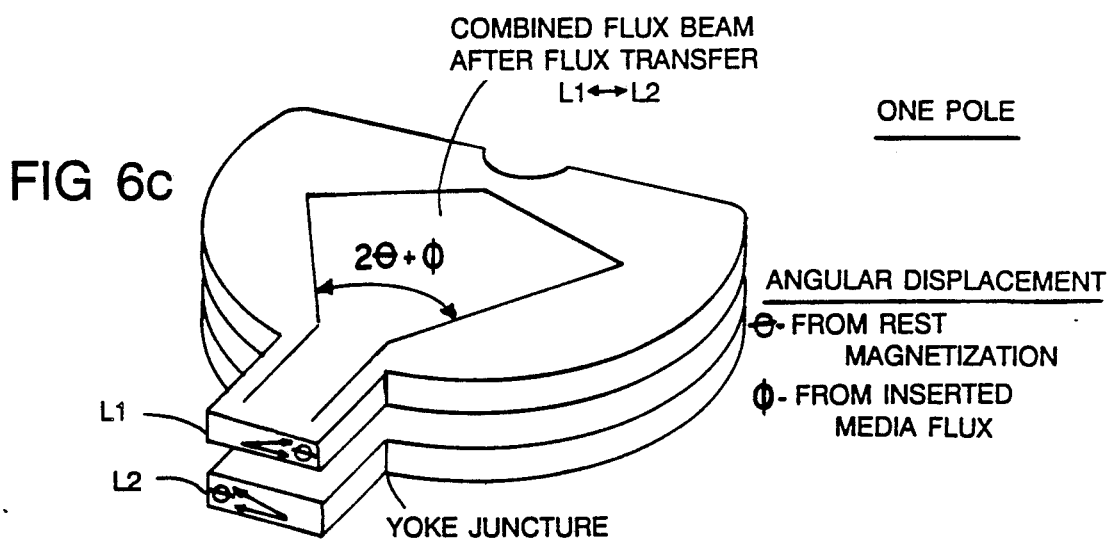
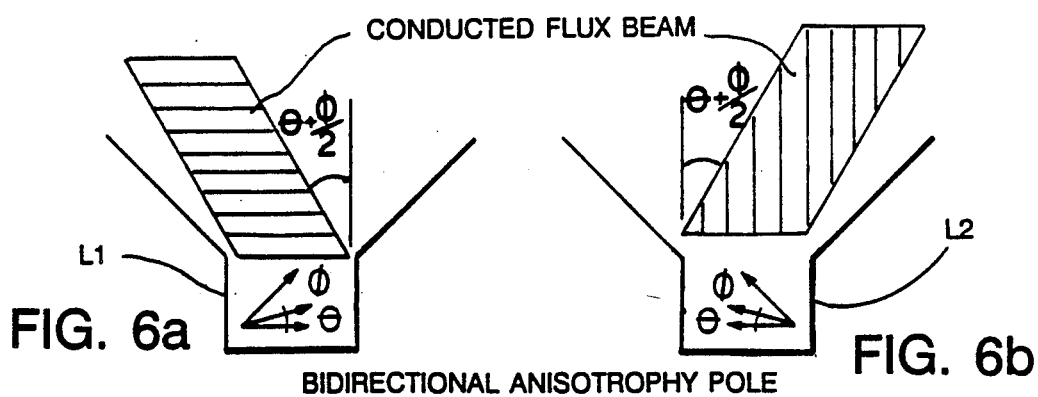

FLUX SPREADING THIN FILM MAGNETIC DEVICES

BACKGROUND OF THE INVENTION

This application is a continuation-in-part of copending application Ser. No. 07/227,808 filed Aug. 3, 1988, assigned to the assignee of the present application.

The present invention relates to rotational flux conduction in thin film magnetic devices.

Magnetic devices, such as thin film recording heads, whether read, read/write, or write, are designed to have particular magnetic orientations, or domains, within the active regions of the device material. The static state of each of these domains can be oriented along a given axis, known as the easy axis (or axis of anisotropy), as desired, by control of the manufacturing process. Performance is critically linked to domain formation, and, therefore, control can be exerted over device performance by controlling domain formation.

Conduction of flux, such as in a thin film recording head, is achieved by two mechanisms: domain wall motion and domain rotation. Domain wall motion results in flux being transmitted through a thin film head along the walls of a domain, or domains, the flux spreading out along the domain walls as the flux seeks to return to equilibrium. However, while domain wall motion facilitates conduction of flux at low frequencies, it is a poor vehicle for conduction of flux at high frequencies. Furthermore, defects in the material in a magnetic head can be the source of Barkhausen noise during conduction of flux by wall motion as the flux is perturbed by these defects. Such noise can result in erroneous readings of recorded data.

A conventional prior art pole of a magnetic recording head is shown in FIG. 1($a$), where medium M will be seen as inserting signal flux into a first transversely oriented domain d1 of a series of transversely oriented domains d1-dn. The rest state flux of the domains is in the X-axis (transverse direction), which leaves a rotational option of flowing into the Y axis (longitudinal direction) or Z axis (vertical direction) in reaction to the signal flux from the medium. The Z-axis is out of plane and is a high reluctance path. Hence the flux will rotate into the Y-axis, as indicated by the rotated arrows of each of domains d1-dn.

In view of the foregoing, it will be understood that conduction of flux by domain rotation may be achieved by configuring a series of neighboring transverse domains axially aligned along parallel axes, where signal flux impinged upon the first domain at a given angle will cause the magnetization of that domain to rotate from its static orientation by that angle radially into and impinging upon the neighboring domain. Such rotation can be transmitted in a like manner along an axis of flux transmission by each neighboring domain of the series. Hence, flux can be conducted in the pole and through the yoke of a thin film head in a series of domain rotations. The yoke enables conduction of flux through a transducer which produces electrical signals proportional to flux levels or the rate of flux change. The transducer might be an induction coil or other flux sensing device. An induction coil is shown schematically in FIG. 1($a$) as it might overlie the bottom pole of a two pole structure.

Further discussion of the flux conduction mechanisms will be found in co-pending patent application entitled: "Perpendicular Anisotropy In Thin Film Devices", U.S. Ser. No. 07/227,813, filed Aug. 3, 1988, which is incorporated herein by reference.

SUMMARY OF THE INVENTION

One aspect of the present invention relates to a method and apparatus for providing rotational flux spreading into the transverse in-plane direction in a flux conduction structure with a preferred rest state not purely in the transverse in-plane direction.

One feature of the invention is to enable rotational flux spreading in the yoke of a magnetic device.

In one preferred embodiment of the invention, a magnetic device has an axis of preferred rest state not purely in the transverse in-plane direction, such that flux spreading into the transverse in-plane direction can occur by rotation.

In some embodiments of the present invention, a magnetic conduction device has two active layers one at least capable of [both]longitudinal and the other at least capable of lateral flux conduction by rotation. These layers are sufficiently isolated from each other at rest such that the domain state of one layer is independent of the other. However, the layers are sufficiently coupled to each other such that signal flux can readily flow therebetween. The layers may have the same width each with different domain orientation or different widths with the same orientations. One layer may include a series of strips to form narrow strips of domains.

In other embodiments of the present invention, the gap between the two layers is small enough to pass rest state domain flux. Also, the preferred orientation of the two layers is mainly transverse but is canted at angles of $+/-$ theta relative to the transverse direction. This canting may be by composition or outside bias source. The coupling of the signal flux between these two layers allows the flux to spread in a wedge with an opening angle of about twice theta for small signal levels.

In still other embodiments of the present invention, four active magnetic layers (A, B, C and D) comprise two pairs of layers (AB and CD). The layers A and B are oriented in the same direction and the gap between A and B is small enough to couple rest state domain flux between them. The layers C and D are similarly configured but their orientation is at a different angle. The gap from B to C is large enough to not conduct rest state domain flux but small enough to conduct signal flux. For example, A and B could be longitudinally oriented while C and D are transversely oriented. Alternatively, A and B could be oriented at plus theta to the transverse direction while C and D are at minus theta.

In yet other embodiments of the present invention having three active layers (A, B and C), A and B are paired as described above and are transversely oriented. The gap from B to C is large enough to block rest state domain flux but small enough to conduct signal flux. Layer C is oriented longitudinally. The pair A and B conducts flux longitudinally even for narrow track widths. The layer C spreads the flux laterally thus to avoid the high impedance flux beam effect. Alternatively, A and B would be oriented longitudinally and C could be oriented transversely.

Other advantages and features will become apparent from the following description of the preferred embodiment and from the claims.

DESCRIPTION OF THE PREFERRED EMBODIMENTS

We first briefly describe the drawings.

FIGS. 5a and 5b respectively show two schematic views of a unidirectional anisotropy prior art head.

FIGS. 6a-6d illustrate flux condition according to alternative embodiments of the present invention.

Figure 7:
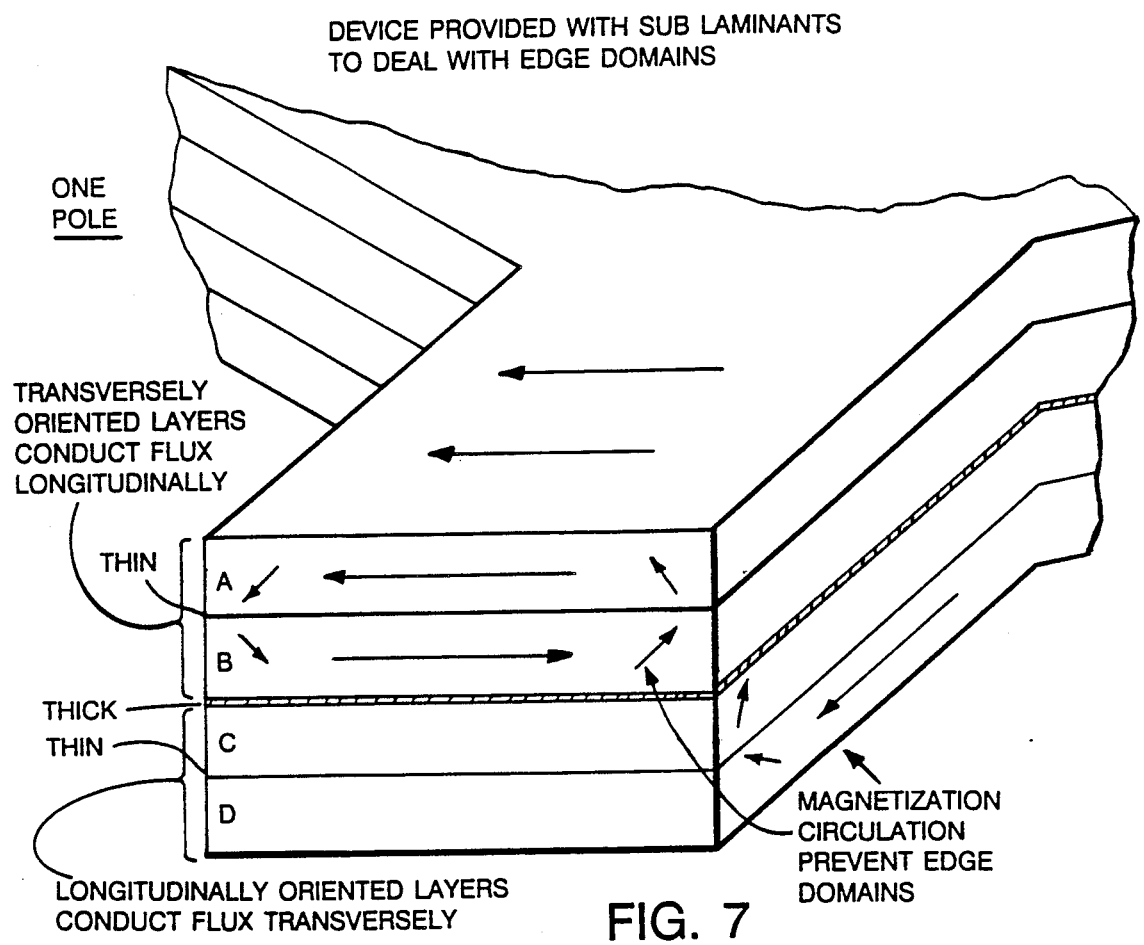

FIG. 7 is a schematic of an alternative laminated embodiment of the present invention having two layers, each layer having a parallel sublayer.

Figure 8:
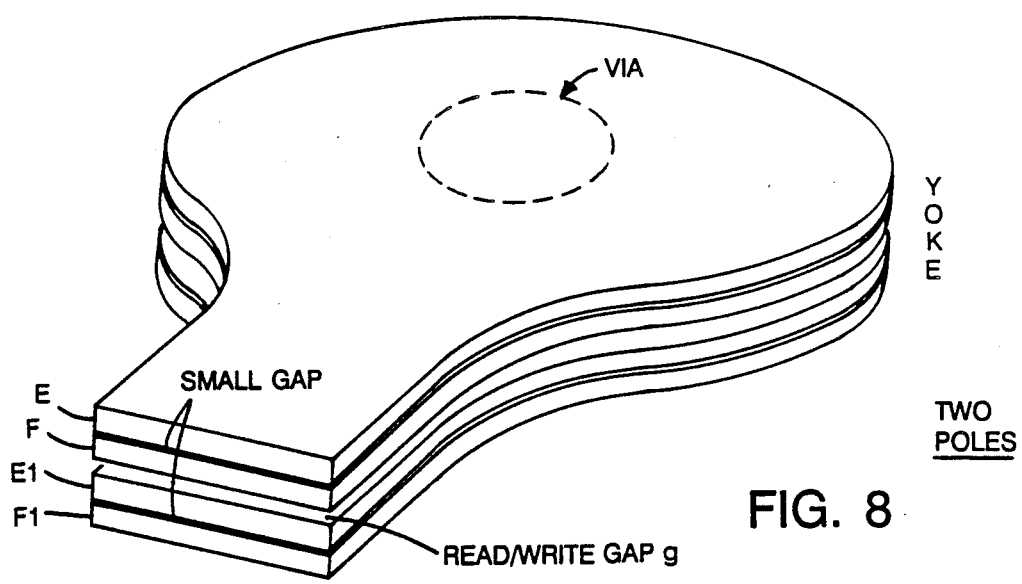

FIG. 8 is a conventional laminated two pole geometry.

Figure 9:
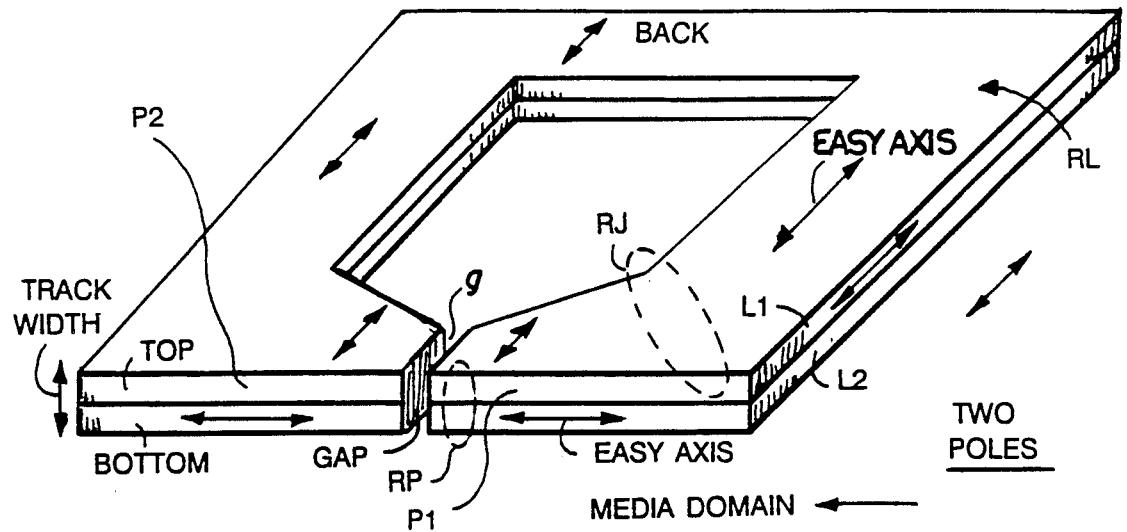

FIG. 9 is a schematic of an alternative embodiment of the present invention where poles P1 and P2 are in the same horizontal plane.

Figure 10:
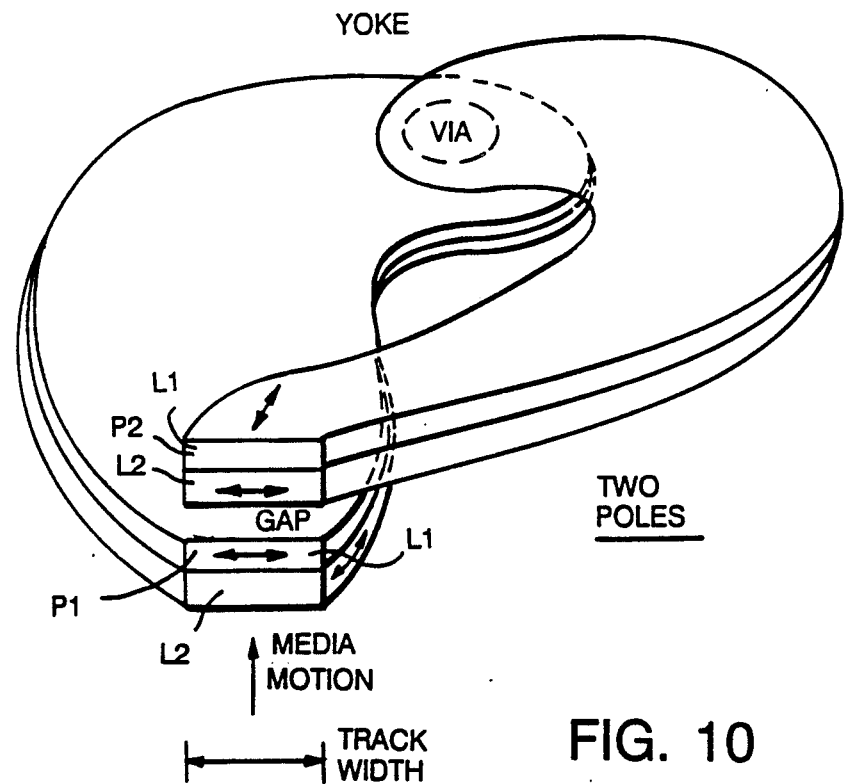

FIG. 10 is a schematic of another alternative embodiment of the present invention where poles P1 and P2 are stacked.

FIG. 11a-11f schematically show six additional embodiments of the invention.

It is desirable that signal flux be efficiently conducted from the pole tip through the yoke of a magnetic conduction device. Thus a low reluctance flux conduction mechanism is desired. The present invention enables low reluctance flux conduction by magnetization rotation at high frequencies. This is achieved by provision of a structure allowing both longitudinal and lateral rotational conductivity. Such multidimensional conductivity obviates the need for domain wall propagation, thus avoiding low response at high frequencies and Barkhausen noise.

The invention is applicable to a wide variety of devices relying upon magnetic conduction, including transformers, magnetic field sensors, bubble memory magnetic structures, thin film magnetic memory elements, magnetic shields, and recording heads, and may be embodied in both single and multi-layered devices.

Figure 1A:
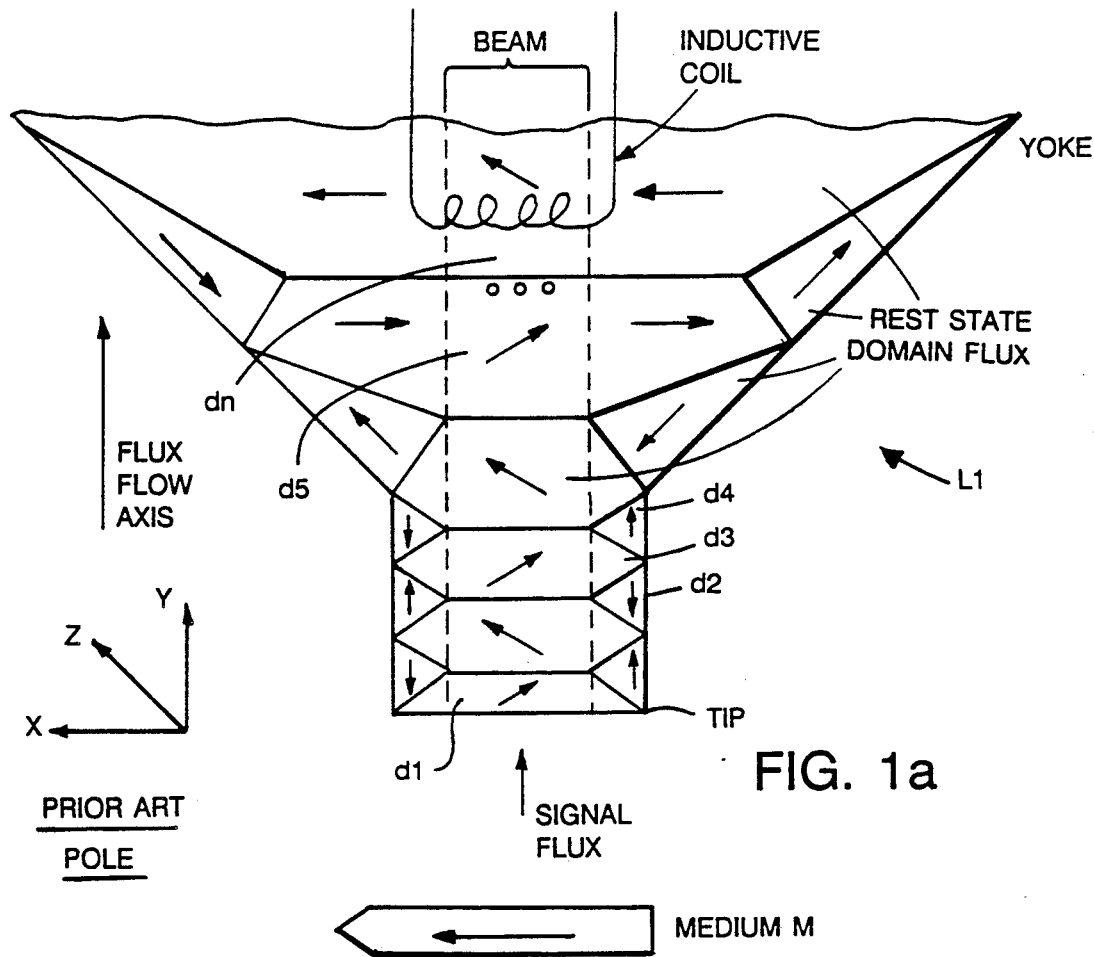
FIG. 1(a) is a schematic view of the top layer of a prior art pole.
Figure 1B:
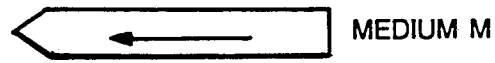
FIG. 1(b) is a cross-sectional view of a two layer configuration of the prior art pole of FIG. 1(a).
Figure 1B:
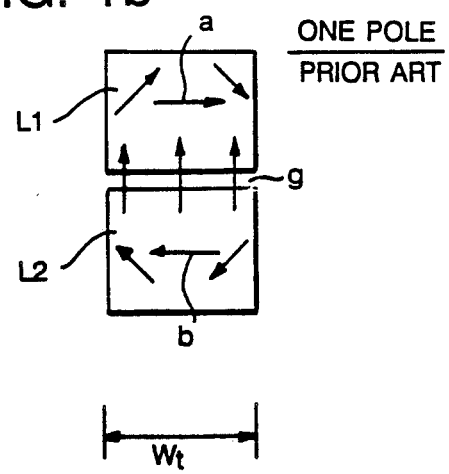

FIG. 1(b) shows in cross-section a two-layer configuration of a prior art pole. Here, layers L1 and L2 are separated by a very narrow gap g to enable coupling between layers L1, L2 of rest state domain flux (i.e., D.C. flux of the domains at rest). The anisotropy directions of layers L1, L2 are parallel to each other and transverse to the pole, as indicated by the horizontal arrows a, b in layers L1, L2, respectively. Also, the thicknesses of L1 and L2 are by design equal.

Figure 2:
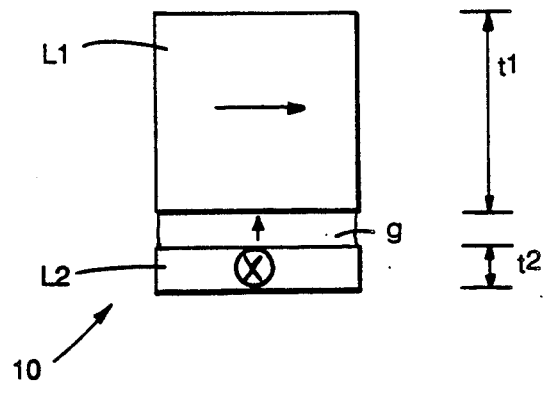
FIG. 2 is a schematic of a two layer pole of a preferred embodiment of the present invention.

Turning to the schematic drawing of FIG. 2, a preferred embodiment of the present invention is shown from a magnetic recording medium looking into the tip of a pole 10 of a magnetic recording head having two active layers, L1, L2, one with in-plane anisotropy (i.e., rest state domain orientation) transversely oriented, and the other layer longitudinally oriented. These layers are separated by a gap layer g. The gap layer is thick enough such that the domain state of each layer will remain independent from each other, but yet is thin enough such that signal flux can transmit readily between the two layers of the pole. In present thin film configurations, perhaps a range of three hundred to two thousand angstroms would be a reasonable target for gap size. In a typical two pole recording head, each pole could have a like configuration. Layers L1 and L2 are preferably configured where L1 thickness t1 does not equal L2 thickness t2. These layers are preferably configured with t1 greater than t2.

Figure 3:
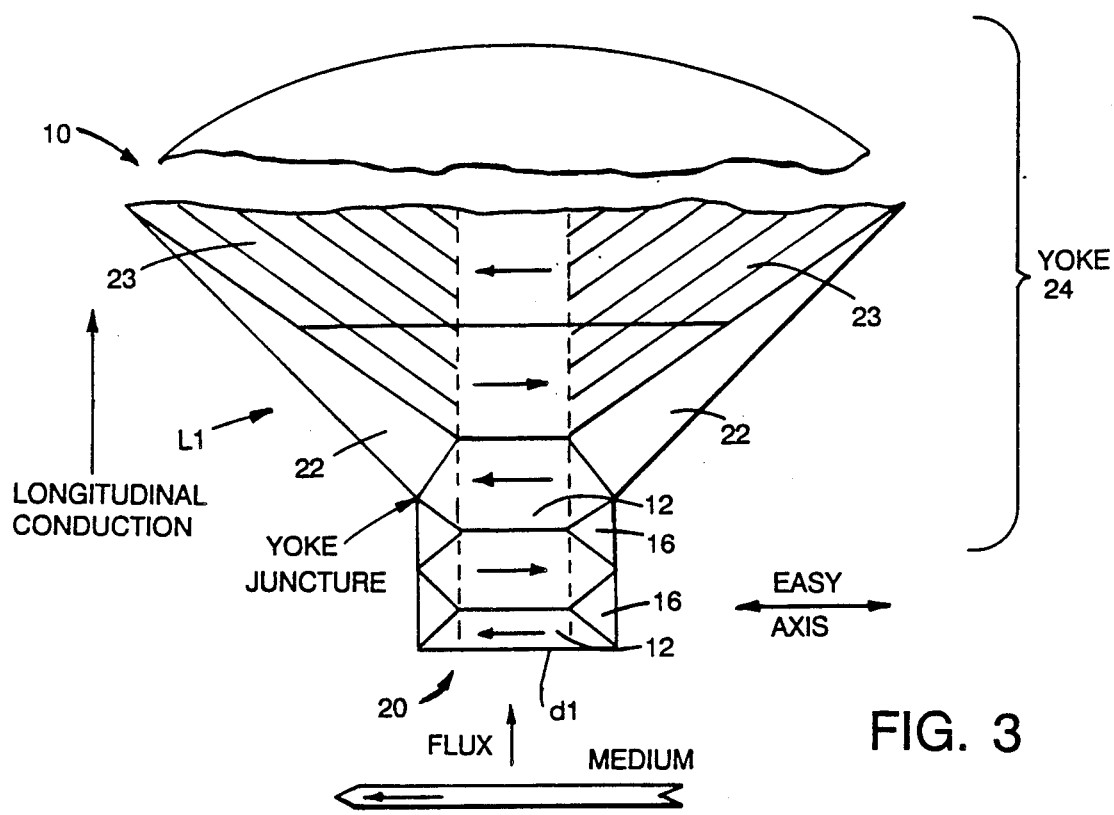
FIG. 3 is a schematic of the top layer of the pole of FIG. 2.

A top view of pole 10 of FIG. 2 is shown in FIG. 3, where the first layer L1 of pole 10 has a preferred easy axis transverse to the longitudinal axis of the pole. The domain structure is configured to have relatively large and uniform central domains 12 with adjacent relatively small edge domains 16 in the region of pole tip 20, and with extended edge domains 22 in the yoke region 24. In this configuration, flux from the medium will be read at the first domain d1 at pole tip 20. As a result, flux will be conducted by rotation, serially propagating down adjacent domains 12, as it heads toward yoke section 24. This conducting mechanism may be referred to as a flux pipe or flux beam, and is schematically indicated by the parallel vertical dotted lines running up the pole from the tip and through the yoke.

Figure 4:
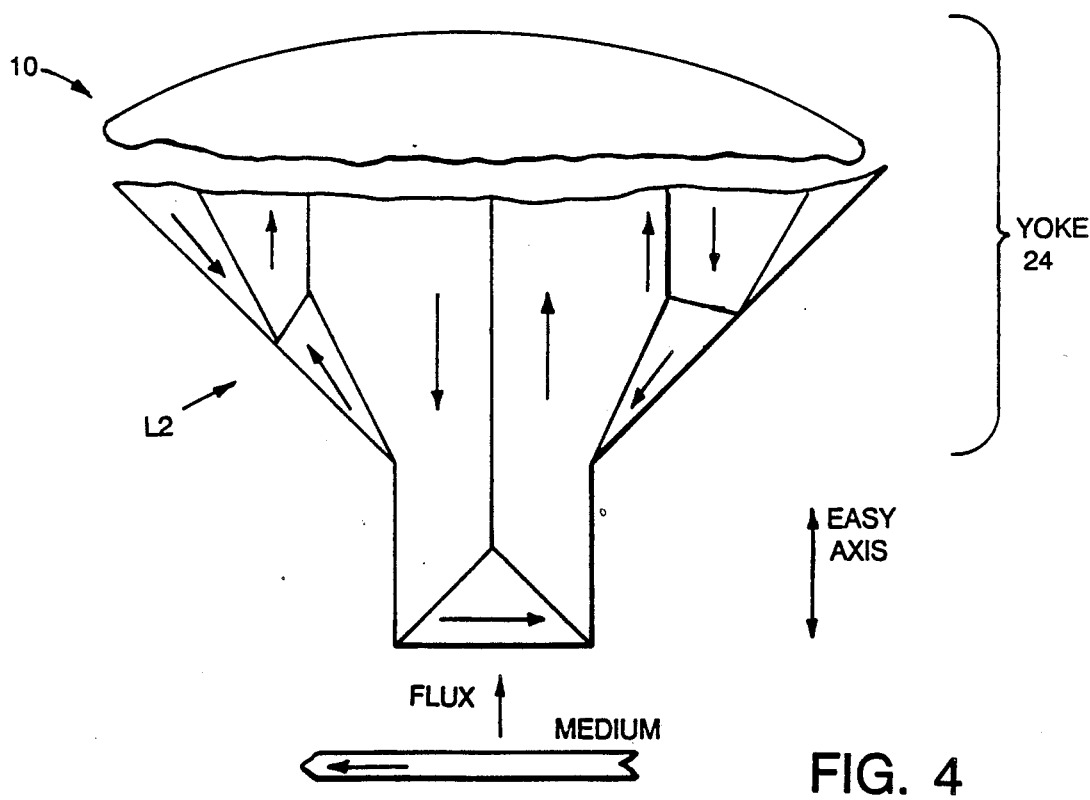
FIG. 4 is a schematic of the bottom layer of the pole of FIG. 2.

A top view of layer L2 of FIG. 2 is shown in FIG. 4. Layer L2 has a longitudinal easy axis, parallel to the longitudinal axis of the pole and transverse to the easy axis of layer L1. The domain structure is substantially longitudinal in orientation. As a result it will conduct flux transversely by rotation.

In FIGS. 3 and 4, the yoke section 24 is shown to increase in width as it extends away from pole tip 20. If the yoke section were not spread, the boundaries of the flux beam would be defined as shown in dotted lines and high reluctance would degrade operation. However, by having this region spread out, the flux beam will somewhat spread out, thus adding to the area within the dotted lines by including at least a portion of the regions indicated by the hash marks 23. This effectively results in a lower reluctance path of conduction through the yoke.

It should be appreciated, however, that mere broadening of the yoke alone is not sufficient to accomplish substantial flux spreading in this embodiment. Rather, it is the cooperation between differently oriented layers $L_1$, $11_2$, of pole piece 10, which facilitates substantial flux spreading. The yoke is broadened therefore to facilitate interaction of these layers. A more detailed description of the flux spreading mechanism as applied to the embodiment of FIGS. 2, 3 and 4 follows.

Flux will be introduced from the magnetic medium into the first transverse domain d1 domain at pole tip 20 perpendicular to the easy axis of the transversely magnetized layer L1. The flux will be propagated longitudinally by rotation down that layer, domain 12 to domain 12, for as long as a low path of reluctance is experienced by the flux. As path length and thus reluctance accumulates, a portion of the flux crosses the gap g and propagates into the longitudinally oriented domain L2, thus lowering the reluctance of the system. The flux will propagate transversely in layer L2 until it accumulates reluctance as will cause it to seek a path of lower reluctance and to jump the gap to re-enter into the transverse layer L1. Once in the transverse layer, the flux propagates longitudinally until accumulated reluctance again causes the flux to seek a lower path of reluctance in the longitudinal active layer on the other side of the gap. This process will continue until the flux has propagated longitudinally through the yoke, but by the virtue of the process of adding a transverse rotational component to flux flow, the flux will have spread out within the widened yoke region, thus reducing total system reluctance.

Thin film heads are being used at higher bit densities. One way to achieve this higher bit density is by reduction of track width. Hence, it is desirable to produce a thin film head having a narrow track width but which also operates at high frequencies. conduction by rotation can enable such achievements.

A narrow track should have a high anisotropy field. This high anisotropy field will act to keep the flux path open by keeping edge domains relatively small. As a result, the rotational mechanism may be kept alive even where the structural magnetic reluctance is lowered in the yoke section according to the present invention, although the high anisotropy field will reduce permeability of the structure.

Figure 11A:
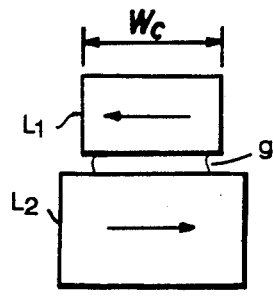

While the embodiment shown in conjuction with FIGS. 2, 3 and 4 includes layer L1 having an axis of anisotropy perpendicular to that of layer L2, it may be considered more convenient to have the same axis of anisotropy for both layers L1 and L2 in the pole. Nevertheless, the same advantageous effect of the invention described with respect to FIGS. 2, 3 and 4 can be obtained. In this alternative, layer L2 might be wider than layer L1, as shown in FIG. 11(a), with layer L2 having a center domain width Wc and layer L1 having a total width the same as the L2 center domain width Wc. In such example, Layer L1 might have a domain configuration as shown in FIG. 11(b), while layer L2 might have a domain configuration as shown in FIG. 11(c). As a result of the relative disparity in width between layer L1 and L2, the edge domains of layer L1 (oriented longitudinally) can be adjacent to the transversely oriented center domains of layer L2. Hence, alternative conduction paths are provided between layers L1 and L2 as will facilitate the flux conduction and spreading mechanism of the invention.

Figure 11E:
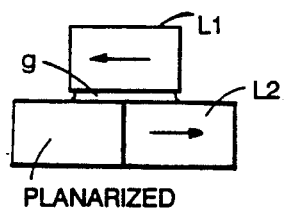

In another alternative embodiment shown in FIG. 11(e), layers L1 and L2 have similar width, but one layer is offset from the other such that edge domains of the one can interact with the center domains of the other. This offset may require a planarized surface to form a gap layer g over which L1 can be formed.

Figure 11F:
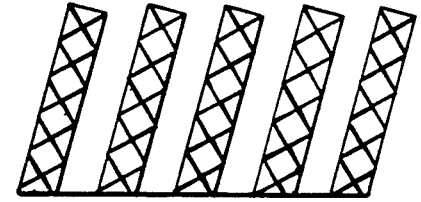
Figure 11B:
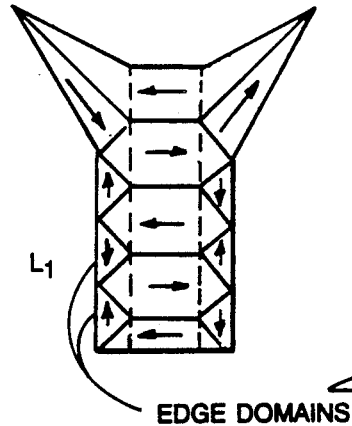
Figure 11C:
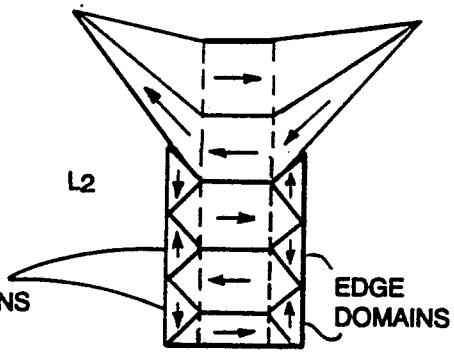
Figure 11D:
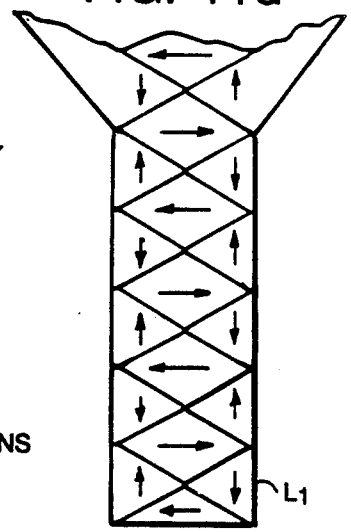

In a further extension of the invention, the width of layer L1 might be so reduced as to totally eliminate its transversely oriented center domain region, as shown in FIG. 11(d), thus providing increased opportunity for the present flux spreading mechanism of the present invention when such layer L1 is combined with a layer L2 configured such as in FIG. 11(c).

In yet an additional alternative, a plurality of narrow magnetic strips such as shown in FIG. 11(f), replaces layer L1. As a result, many longitudinal edge domains can be provided so to interact with the transversely oriented center domain region of the underlying layer L2. In particular, such narrow strips can be provided with a low anisotropy as would eliminate their central domain regions, thus providing a maximum amount of transversely oriented edge domain per thin strip. In an extreme case the criss-cross orientation shown in the strips of FIG. 11f would become primarily longitudinally oriented.

In the design of a narrow track head, laminated films often are used to eliminate edge domains and 180° walls. Therefore, these laminated films will not spread flux well in conventional configurations, and can negate the benefits described above.

Referring to FIGS. 5a and 5b, each of which includes schematic complementary views of a unidirectional anisotropy prior art head not having the cooperating layers of the present invention, it will be seen that the flux imposed at an angle phi (or 180° minus phi) from the medium upon the transversely oriented magnetization will cause a rotation of the magnetization by such angle. In all other aspects a uniform beam will be conducted back through the pole into and through the yoke, except that it will be canted by one half of phi. As a result, a high magnetic impedance will be experienced at the yoke because the flux beam does not widen significantly.

The present invention, in an alternative preferred embodiment, achieves flux spreading by orienting the easy axes of the top and bottom layers of laminated poles at plus and minus angles, theta, relative to the transverse magnetic direction. As a result, the flux will then spread out in a wedge angle of twice the value of theta, plus the additional angular component phi caused by the flux rotation. The wedge-creating embodiment of the present invention is shown conceptually in FIGS. 6(a), 6(b) and 6(c), where in 6(a) the first active layer L1 has been imparted a static angular displacement of its magnetic orientation at an angle theta measured from the transverse axis. The second active layer L2 is shown in FIG. 6(b) having a complementary magnetic orientation at rest at an angle of minus theta (i.e., 180° minus theta). When flux is impinged upon the L1 and L2 layers normal to the transverse axis, then the resulting flux beam will be spread equivalent to twice theta plus the rotational component phi for each layer (i.e., one-half phi plus one-half phi). Thus, the flux beam will be the summation of the two angularly and rotationally displaced flux beams of each layer, amounting to two theta plus phi, as shown in FIG. 6(c). It is preferred in this configuration that the gap between the two laminated layers is small enough to pass rest state domain flux.

In operation, flux from the magnetic medium will enter the pole tip and be conducted back to the yoke juncture by rotation in both layers. As the flux enters the yoke juncture, the top layer directs a flux beam off at an angle theta relative to the axis of symmetry of the pole, and the bottom layer directs the flux beam off at an angle 180° minus theta. Conduction of flux between the layers allows the top layer to insert flux into the bottom one in positive theta regions and vice versa.

The rotational process alone may be insufficient to conduct flux laterally, to any sufficient degree, in the widening sections of the yoke of a typical thin film head. Therefore, wall motion conduction must be relied upon in the absence of any alternatives. This situation may even be worse in regard to laminated yokes with purely transverse anisotropy because the wall motion mechanism is blocked by lamination.

Figure 6D:
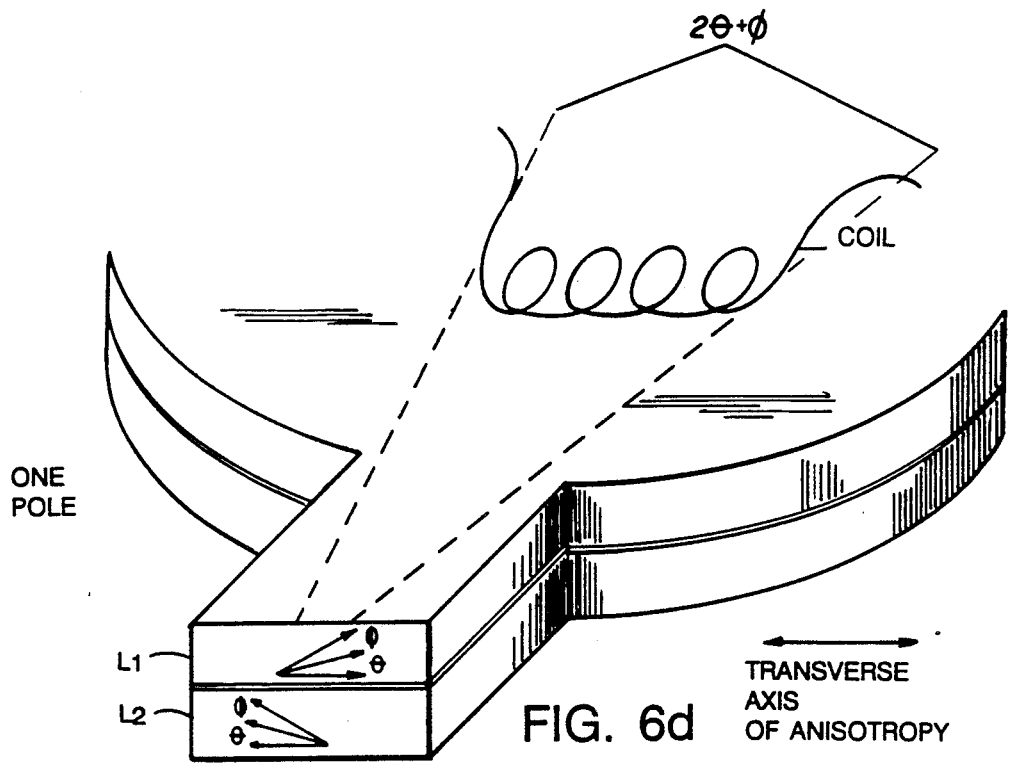

These problems can be overcome by the configuration shown in FIG. 6(d), where an externally applied bias field supplies Θ angular displacement of transversely oriented domains to cause signal flux to spread in a pie-shaped configuration extending out to the yoke. Hence, the embodiment of FIG. 6(d) operates analogously to that of FIG. 6(c), except that now the at rest domain states of layer L1 and L2 are oriented along the transverse axis of anisotropy, and angular displacement Θ is provided by the DC bias field from the coil. In either case, the flux imposed from the media at an angle φ will cause a further rotation of the magnetization. As a result, as suggested in FIGS. 6(a) and 6(b), the flux beam will cant at an angle Θ plus one-half φ for layer L1 and will oppositely cant at Θ plus one-half φ for layer L2. This canting will again combine into a flux spreading profile of twice Θ plus φ.

Thus it will be appreciated that the distinction between the embodiment of FIG. 6(d) and that of FIG. 6(c) resides in that the angular displacement of the rest state magnetization is nil in FIG. 6(d) and is Θ in FIG. 6(c), with theta displacement of the at rest magnetization being supplied in FIG. 6(d) by an external bias source. In a preferred embodiment, a small current is applied to the read/write coil in a typical thin film head having a laminated pole structure to supply the required external bias. Alternatively, an additional bias source may be included in such head, including an additional coil, a permanent magnet or an external bias field, for example. In any event, the bias field cants the rest state magnetization away from the transverse direction to provide the beneficial effect described above.

In other embodiments of the invention utilizing laminated films, two or more active magnetic layers can be employed. In a particular embodiment, one pole of which is illustrated in FIG. 7, four active magnetic layers (A, B, C and D) comprise two pairs (AB and CD) of layers. The layers A and B are oriented in the same direction and the gap between A and B is small enough to couple rest state domain flux between them. The layers C and D are similarly configured but their orientation is at a different angle. The gap from B to C is large enough to not conduct rest state domain flux but small enough to conduct signal flux. For example, A and B could be longitudinally oriented while C and D are transversely oriented. Alternatively, A and B could be oriented at plus theta to the transverse direction while C and D are at 180° minus theta.

An alternative configuration of the embodiment of FIG. 7 is provided having three active layers (A, B and C), A and B are paired as described above and are transversely oriented. The gap from B to C is large enough to block rest state domain flux but small enough to conduct signal flux. Layer C is oriented longitudinally. The pair A and B conducts flux longitudinally even for narrow track widths. The layer C spreads the flux laterally thus to avoid the high impedance flux beam effect. Alternatively, A and B could be oriented longitudinally and C could be oriented transversely.

FIG. 8 shows a conventional two pole yoke geometry where the top and bottom halves of the yoke are symmetrical, and the tips are centered about gap g. The foregoing configurations of the invention can be applied to this geometry. By doing so, flux spreading by rotation will be achieved while preserving flux conduction by rotation in the longitudinal direction. Each pole is shown to have been laminated into two active magnetic layers E,F and E1,F1.

These above-described configurations of the invention can also be applied to the geometries shown in FIGS. 9 and 10. Here, the invention not only aids in flux spreading by rotation, but also facilitates transverse flux conduction by rotation. For example, in the configuration shown in FIG. 9, poles P1 and P2 are horizontal. Their first layer L1 is longitudinally oriented. Layer L2 is transversely oriented. Flux entering the right hand pole tip near the gap in region RP is initially conducted to the right in the top longitudinally oriented layer. When the flux reaches the juncture with the right hand leg in region RJ, it will transfer to the bottom layer and be conducted toward the back of that pole in that transversely oriented layer. When the flux reaches the back section of the yoke, it must jump back into the top layer in order to travel leftward by rotation. The flux travels in a complementary manner to complete the flux path back to the left hand pole tip.

In FIG. 10, poles P1 and P2 are stacked. The first layer L1 extends over each pole and is longitudinally oriented. Layer L2 is transversely oriented and extends over each pole. Vias are provided in the yoke to assure coupling between respective portions of each layer. In this embodiment, the same process occurs as in the embodiment of FIG. 9, but the turns on the path are not abrupt. Also, the pole tips are stacked.

It will be appreciated that a transducer must be associated with the yoke in order to generate electrical signals from the signal flux in the device. Various transducer configurations would be operable with practice of the present invention. Manufacturing:

In a dry vacuum deposition approach, the transversely oriented layer can be deposited on a wafer substrate by placing the wafer in a transversely oriented magnetic field during deposition. (Alternately, this can be accomplished by growing the film with a crystal orientation that places a crystallographically oriented axis in the transverse direction.)

The transversely oriented magnetic field can be supplied by coils or by the magnetron target magnets of a sputtering machine, for example. Also, the deposition can be made at angles normal or other than normal to the surface, where the incident direction establishes the preferred axis. For example, one layer might have a field direction at plus theta to the transverse direction, and the other layer might be oriented at minus theta. During subsequent heat treatment, exclusion of all fields would allow the two layers to self bias. Furthermore, in a configuration where an external transverse field is needed to be present to orient other head layers, then the easy axis in both layers could be established at some angle greater than theta, such that after anneal they would relax to angle theta.

After the first layer is laid down, then a buffer layer (non-magnetic) can be deposited. For dry deposition, it is convenient to use a ceramic which can be made thinner than a metal and will stop exchange coupling between the first and the next layer. In orthogonal configurations, for example, the second magnetic layer will be deposited either with the wafer rotated 90° to the first deposition position, or the magnetic field rotated 90°. After these layers are deposited, the yoke may be formed by means of a masked ion milling process.

Where it is believed advantageous to sub-laminate each of the oriented layers, orientation direction of magnetization in the sublayers paired together preferably would be in the same direction. It may be found that dry deposition is more suited to this type of heavily laminated structure.

For wet processing, each layer is deposited through a plating mask in a bias field to establish appropriate magnetic domain orientation. The nonmagnetic layer can be plated if it is a metal, for example Ni—P, Au, Cu, etc. If a ceramic is used for the buffer layer, then this must be sputtered after the mask has been removed. The structure is now ready to receive the next magnetic layer, whereupon a seed layer and mask will be laid down, and the layer will be plated thereon.

A problem with the technology described above resides in that any exposure to very high temperatures (for example, greater than 200° C. for greater than half an hour for NiFe poles) will degrade the induced anisotropy obtained by depositing in a field. This sensitivity can be overcome by using the angle of incidence approach to inducing anisotropy as discussed above in regard to dry deposition. In particular, it is possible to deposit the first layer of the bottom of the yoke in a longitudinally oriented field. This layer can be annealed in the field at a temperature that is much higher than the process temperatures used in the rest of the process. Next, the top layer of the bottom of the yoke and the bottom layer of the top of the yoke may be deposited in a transverse field, which field is maintained during high temperature processing. Thereafter the top layer of the top yoke may be deposited in a longitudinal field and which is not annealed. Only the bottom layer then has experienced an anisotropy-lowering anneal, and it will retain only some of its orientation. Nevertheless, orientation of this lowest layer, while important for yoke conductivity, is not critical for pole tip conductivity, and therefore such conductivity can be diminished.

Pole materials which may be used in the above processes include alloys of nickel, iron and cobalt, and magnetic garnet and ferrite crystals, to name a few alternatives.

Other embodiments are within the following claims.

What is claimed is:

1. A magnetic device for conducting signal flux therethrough, comprising:
   a plurality of magnetic layers, a first one of said layers including first magnetic domains oriented to cause said signal flux to conduct by rotation in a first direction through said layer, and a second one of said layers having second magnetic domains oriented differently from said first domains to cause said signal flux to conduct by rotation in a second, different direction through said one layer,
   said layers being arranged so that said first magnetic domains of said first layer are disposed adjacent to said second magnetic domains of said second layer, and said layers being coupled to each other to allow said signal flux to pass between said layers to that said signal flux conducts by rotation through said device by following said first and second directions.

2. The device of claim 1 wherein said first magnetic domains are disposed in a region of said first layer and said second magnetic domains are disposed in a region of said second layer, said layers disposed so that said regions are in overlaying relationship to allow said signal flux to pass between said second domains and said first domains.

3. The device of claim 2 wherein each of said layers has a width dimension transverse to said first direction, the width of said first layer being different from the width of said second layer.

4. The device of claim 2 wherein said first layer and said second layer are offset from each other in a direction transverse to said first direction to cause said region of said first layer and said region of said second layer to be in said overlaying relationship.

5. The device of claim 4 wherein each of said layers has a width dimension in said transverse direction, said first and second layers having equal widths.

6. The device of claim 4 wherein said first layer is disposed over said second layer, and further comprising a support layer disposed adjacent to said second layer and under a portion of said first layer.

7. The device of claim 6 wherein said support layer is planarized.

8. The device of claim 1 wherein said first layer further includes said second magnetic domains.

9. The device of claim 1 wherein said second layer further includes said first magnetic domains.

10. The device of claim 1 wherein said second layer includes a plurality of strips, each of which includes said second magnetic domains and is arranged relative to said first layer to allow said signal flux to pass between said first layer and said strip so that said signal flux conducts by rotation through said device by following said first and second directions.

11. The device of claim 10 wherein said second layer further includes said first magnetic domains and said strips have primarily only said second magnetic domains.

12. The device of claim 1 wherein said layers are separated from each other to avoid flux conduction therebetween when said signal flux is absent.

13. The device of claim 12 wherein said first layer and said second layer each comprises a plurality of magnetic layers.

14. The device of claim 1 wherein said layers are coupled together to allow flux conduction therebetween when said signal flux is absent.

15. The device of claim 14 wherein said first layer and said second layer each comprises a plurality of magnetic layers.

16. The device of claim 1 wherein said first magnetic domains and said second magnetic domains are oriented perpendicularly to each other.

17. The device of claim 16 wherein said first magnetic domains are oriented perpendicularly to said first direction.

18. The device of claim 1 wherein said second layer further includes said first magnetic domains, said first magnetic domains of said first layer being oriented obliquely to said first magnetic domains of said second layer.

19. The device of claim 1 wherein said second layer further includes said first magnetic domains, said first magnetic domains of said first layer and said first magnetic domains of said second layer nominally being oriented in the same direction, and further comprising means for causing said first magnetic domains of said first layer and said first magnetic domains of said second layer to become oriented obliquely to each other.

20. The device of claim 19 wherein said means includes a bias coil disposed adjacent to at least one of said layers for conducting electrical current, said current inducing said oblique orientation.

21. The device of claim 20 wherein said layers respectively comprise a pair of poles of a thin film head that includes a write coil for causing said head to write information on a magnetic medium, said write coil serving as said bias coil.

22. The device of claim 1 constructed as a magnetic transducer, said first and second layers respectively comprising a pair of magnetic poles for conducting said signal flux from a storage medium to a yoke section of said transducer, said magnetic poles being coupled together in said yoke section and having tips that are stacked one upon the other, separated by a gap, and arranged to be disposed adjacent to said storage medium.

23. The device of claim 1 constructed as a magnetic transducer, said first and second layers respectively comprising a pair of magnetic poles for conducting said signal flux from a storage medium to a yoke section of said transducer, said magnetic poles being coupled together in said yoke section and having tips that are separated by a gap and arranged to be disposed adjacent to said storage medium, said poles being coplanar and disposed adjacent to each other.

24. The device of claim 1 constructed as a magnetic transducer, said first and second layers respectively comprising a pair of magnetic poles that are disposed on a common plane of deposition.

25. The device of claim 1 constructed in a transformer, said first layer and said second layer being arranged to provide a laminated yoke of said transformer.

26. The device of claim 1 constructed as a magnetic field sensor, said first layer and said second layer being arranged to provide a laminated magnetic structure for detecting and conducting flux applied to said sensor.

27. The device of claim 1 constructed as a bubble memory magnetic field structure, said first layer and said second layer being arranged to provide at least one laminated memory element thereof.

28. The device of claim 1 wherein said first layer and said second layer are arranged to provide a laminated magnetic memory element.

29. The device of claim 1 wherein said first layer and said second layer are arranged to provide a laminated magnetic shield.

30. The device of claim 1 further comprising at least one additional magnetic layer having magnetic domains oriented parallel to said first magnetic domains of said first layer, said first layer and said additional layer being coupled together to allow flux conduction between said magnetic domains of said layers when said signal flux is absent.

31. The device of claim 1 further comprising at least two additional magnetic layers, one of said additional layers having magnetic domains oriented parallel to said first magnetic domains of said first layer and being coupled to said first layer to allow flux conduction between said magnetic domains when said signal flux is absent, and a second of said additional layers having magnetic domains oriented parallel to said second magnetic domains of said second layer and being coupled to said second layer to allow flux conduction between said magnetic domains when said signal flux is absent, and wherein said first magnetic layer and said second magnetic layer are separated from each other to avoid flux conduction between said magnetic domains of said first and second layers when said signal flux is absent.

32. The device of claim 1 wherein said first direction is oriented along a longitudinal axis and said second direction is oriented transversely to said longitudinal axis, whereby said flux is caused to conduct by rotation along said first direction by said first layer and said second layer permits said flux to spread transversely to said longitudinal axis while conducting by rotation.

33. The device of claim 32 wherein said second direction is perpendicular to said first direction.

34. The device of claim 1 wherein said first and second directions are oriented at opposite oblique angles with respect to a longitudinal axis, whereby said first and second layers conduct said flux generally along said longitudinal axis while allowing said flux to spread transversely to said longitudinal axis by an amount defined by said oblique angles.

35. The device of claim 1 wherein said first magnetic layer has a thickness that is greater than a thickness of said second magnetic layer.

36. A magnetic device for conducting signal flux therethrough, comprising:

at least one pole that includes a plurality of magnetic layers, a first one of said layers including first magnetic domains oriented to cause said signal flux to conduct by rotation in a first direction through said layer, and a second one of said layers having second magnetic domains oriented differently from said first domains to cause said signal flux to conduct by rotation in a second, different direction through said one layer, said layers being arranged so that said first magnetic domains of said first layer are disposed adjacent to said second magnetic domains of said second layer, and said layers being coupled to each other to allow said signal flux to pass between said layers so that said signal flux conducts by rotation through said device by following said first and second directions.

37. The device of claim 36 wherein said first magnetic layer has a thickness that is greater than a thickness of said second magnetic layer.

38. The device of claim 36 further comprising a second said pole coupled to the first-mentioned pole.

39. A method for making a magnetic conduction device comprising the steps of:

configuring a first magnetic layer with first magnetic domains oriented to conduct signal flux in a first direction by rotation of said first domains, configuring a second magnetic layer with second magnetic domains oriented differently from said first domains to conduct said signal flux in a second, different direction by rotation of said second domains, and arranging said layers so that said first magnetic domains of said first layer are disposed adjacent to said second magnetic domains of said second layer, and coupling said layers to each other to allow said signal flux to pass between said layers so that said signal flux conducts by rotation through said device by following said first and second directions.

40. The method of claim 39 wherein said first magnetic domains are disposed in a region of said first layer and said second magnetic domains are disposed in a region of said second layer, further comprising disposing said layers so that said regions are in overlaying relationship to allow said signal flux to pass between said second domains and said first domains.

41. The method of claim 40 further comprising offsetting said first layer and said second layer from each other in a direction transverse to said first direction to cause said region of said first layer and said region of said second layer to be in said overlaying relationship.

42. The method of claim 41 wherein each of said layers has a width dimension in said transverse direction, said first and second layers having equal widths.

43. The method of claim 41 further comprising disposing said first layer over said second layer, and disposing a support layer adjacent to said second layer and under a portion of said first layer.

44. The method of claim 43 further comprising planarizing said support layer.

45. The method of claim 39 wherein each of said layers has a width dimension transverse to said first direction, the width of said first layer being different from the width of said second layer.

46. The method of claim 39 wherein said first layer further includes said second magnetic domains.

47. The method of claim 39 wherein said second layer further includes said first magnetic domains.

48. The method of claim 39 wherein said second layer includes a plurality of strips, each of which includes said second magnetic domains, and further comprising arranging said strips relative to said first layer to allow said signal flux to pass between said first layer and said strips so that said signal flux conducts by rotation through said device by following said first and second directions.

49. The method of claim 48 wherein said second layer further includes said first magnetic domains and said strips have primarily only said second magnetic domains.

50. The method of claim 39 further comprising separating said layers from each other to avoid flux conduction therebetween when said signal flux is absent.

51. The method of claim 50 wherein said first layer and said second layer each comprises a plurality of magnetic layers.

52. The method of claim 39 further comprising coupling said layers together to allow flux conduction therebetween when said signal flux is absent.

53. The method of claim 52 wherein said first layer and said second layer each comprises a plurality of magnetic layers.

54. The method of claim 39 wherein said first magnetic domains and said second magnetic domains are oriented perpendicularly to each other.

55. The method of claim 54 wherein said first magnetic domains are oriented perpendicularly to said first direction.

56. The method of claim 39 wherein said second layer further includes said first magnetic domains, said first magnetic domains of said first layer being oriented obliquely to said first magnetic domains of said second layer.

57. The method of claim 39 wherein said second layer further includes said first magnetic domains, said first magnetic domains of said first layer and said first magnetic domains of said second layer nominally being oriented in the same direction, and further comprising causing said first magnetic domains of said first layer and said first magnetic domains of said second layer to become oriented obliquely to each other.

58. The method of claim 57 wherein said causing step includes applying electrical current through a bias coil disposed adjacent to at least one of said layers to induce said oblique orientation.

59. The method of claim 58 wherein said layers respectively comprise a pair of poles to a thin film head that includes a write coil for causing said head to write information on a magnetic medium, said write coil serving as said bias coil.

60. The method of claim 39 further comprising
providing at least one additional magnetic layer and
configuring said at least one additional layer with magnetic domains oriented parallel to said first magnetic domains of said first layer, and
coupling said first layer and said additional layer together to allow flux conduction between said magnetic domains of said layers when said signal flux is absent.

61. The method of claim 39 further comprising
providing at least two additional magnetic layers,
configuring a first one of said additional layers with magnetic domains oriented parallel to said first magnetic domains of said first layer, and coupling said first additional layer to said first layer to allow flux conduction between said magnetic domains when said signal flux is absent,
configuring a second one of said additional layers with magnetic domains oriented parallel to said second magnetic domains of said second magnetic layer, and coupling said second additional layer to said second layer to allow flux conduction between said magnetic domains when said signal flux is absent,
separating said first magnetic layer and said second magnetic layer from each other to avoid flux conduction between said magnetic domains of said first and second layers when said signal flux is absent.

62. The method of claim 39 further comprising disposing said first magnetic layer upon a substrate by vacuum deposition.

63. The method of claim 62 further comprising depositing a gap layer upon said first magnetic layer.

64. The method of claim 63 further comprising providing said gap layer with a thickness of between 300 and 2000 angstroms.

65. The method of claim 63 further comprising forming said second magnetic layer over said gap layer.

66. The method of claim 65 further comprising forming said second magnetic layer by dry deposition.

67. The method of claim 65 further comprising forming said second magnetic layer by plating.

68. The method of claim 63 wherein said gap layer includes ceramic material.

69. The method of claim 39 further comprising annealing said first magnetic layer.

70. The method of claim 69 further comprising applying a magnetic field during said annealing to orient said first magnetic domains to conduct said signal flux by rotation in said first direction.

71. The method of claim 39 further comprising forming said first magnetic layer from a material having a crystal axis, said first magnetic domains being oriented along said crystal axis.

72. The method of claim 39 further comprising disposing said first magnetic layer along a longitudinal axis and orienting said first magnetic domains to conduct said signal flux by rotation along said longitudinal axis.

73. The method of claim 72 further comprising disposing said second magnetic layer along a longitudinal axis and orienting said second magnetic domains to conduct said signal flux by rotation in a direction transverse to said longitudinal axis.

74. The method of claim 39 further comprising orienting said first magnetic domains by magnetostriction.

75. The method of claim 39 further comprising orienting said first magnetic domains by applying a magnetic field to said first magnetic layer.

76. The method of claim 39 further comprising forming said first magnetic layer from a plurality of laminated layers having magnetic domains oriented in parallel.

77. A method for making a magnetic device for conducting signal flux therethrough, comprising:

providing at least one pole that includes a plurality of magnetic layers, configuring a first one of said layers with first magnetic domains oriented to cause said signal flux to conduct by rotation in a first direction through said layer.

configuring a second one of said layers with second magnetic domains oriented differently from said first domains to cause said signal flux to conduct by rotation in a second, different direction through said one layer, and arranging said layers so that said first magnetic domains of said first layer are disposed adjacent to said second magnetic domains of said second layer, and coupling said layers to each other to allow said signal flux to pass between said layers so that said signal flux conducts by rotation through said device by following said first and second directions.

78. The method of claim 77 further comprising providing a second pole coupled to the first-mentioned pole.

* * * * *

UNITED STATES PATENT AND TRADEMARK OFFICE
CERTIFICATE OF CORRECTION

PATENT NO.   : 5,085,935

DATED        : February 4, 1992

INVENTOR(S)  : Michael L. Mallary

It is certified that error appears in the above-identified patent and that said Letters Patent are hereby corrected as shown below:

Col. 3, line 17, "condition" should be --conduction--.
      line 30, after "additional" insert --alternative--.

Col. 5, line 9, "conduction" should be "Conduction--.

Col. 8, line 20, after "invention" start a new paragraph.

Col. 16, claim 78, Line 9, after "second" insert --said--.
COL. 9,
Claim 1     line 6, insert --first-- before "layer".
Column 12   line 9, replace "one" with --second--.

Claim 36 line 6, insert "first-- before "layer".
      line 10, replace "one" with --second--.
COLUMN 15,
Claim 77 , line 7, insert "first-- before "layer".
      line 11, replace "one" with --second--.

Signed and Sealed this

Thirteenth Day of July, 1993

Attest:

MICHAEL K. KIRK

Attesting Officer

Acting Commissioner of Patents and Trademarks